United States Patent
Jurenka (12) 
(10) Patent No.: US 11,302,851 B2
(45) Date of Patent: Apr. 12, 2022

(54) COMPONENT WITH A REFLECTIVE HOUSING AND METHOD FOR PRODUCING SUCH A COMPONENT

(71) Applicant: OSRAM Opto Semiconductors GmbH, Regensburg (DE)

(72) Inventor: Claudia Jurenka, Fahrenbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 17/291,208

(22) PCT Filed: Nov. 28, 2019

(86) PCT No.: PCT/EP2019/082904
§ 371 (c)(1),
(2) Date: May 4, 2021

(87) PCT Pub. No.: WO2020/109465
PCT Pub. Date: Jun. 4, 2020

(65) Prior Publication Data
US 2021/0359178 A1    Nov. 18, 2021

(30) Foreign Application Priority Data
Nov. 30, 2018  (DE) .............. 10 2018 130 526.5

(51) Int. Cl.
*H01L 51/52* (2006.01)
*H01L 33/60* (2010.01)
(Continued)

(52) U.S. Cl.
CPC ............ *H01L 33/60* (2013.01); *B29C 70/585* (2013.01); *F21V 9/30* (2018.02); *H01L 25/0753* (2013.01);
(Continued)

(58) Field of Classification Search
CPC ......... H01L 33/50; H01L 33/56; H01L 33/60; H01L 25/0753
See application file for complete search history.

(56) References Cited

U.S. PATENT DOCUMENTS 4,581,288 A * 4/1986 Barnhart ................. C08K 3/40
                                                        351/159.61
2018/0134922 A1* 5/2018 Katami ................. C09J 201/00
(Continued)

FOREIGN PATENT DOCUMENTS

DE    102009036622 A1    2/2011
DE    102017117536 A1    2/2019

OTHER PUBLICATIONS

International Search Report and Written Opinion issued in International Application No. PCT/EP2019/082904 dated Mar. 18, 2020.

*Primary Examiner* — Andrew J Coughlin
(74) *Attorney, Agent, or Firm* — Arentfox Schiff LLP (57) ABSTRACT

In one embodiment, the component comprises a light reflective housing. The housing comprises a matrix material of a light-transmittive plastic and particles of a glass ceramic embedded therein. The particles comprise a mean diameter of at least 5 μm. The particles comprise a glass matrix and crystallites. A refractive index difference between the glass matrix and the crystallites is at least 0.5, and the crystallites exhibit a mean diameter between 20 nm and 0.5 μm, inclusive.

19 Claims, 4 Drawing Sheets

(51) Int. Cl.
*F21V 9/30* (2018.01)
*B29C 70/58* (2006.01)
*H01L 25/075* (2006.01)
*H01L 31/0232* (2014.01)
*H01L 33/56* (2010.01)
*F21Y 115/10* (2016.01)
*B29K 509/08* (2006.01)
*B29L 31/34* (2006.01)

(52) U.S. Cl.
CPC ........ *H01L 31/02327* (2013.01); *H01L 33/56* (2013.01); *B29K 2509/08* (2013.01); *B29K 2995/003* (2013.01); *B29L 2031/34* (2013.01); *F21Y 2115/10* (2016.08); *H01L 2933/0058* (2013.01); *H01L 2933/0091* (2013.01)

(56) References Cited

U.S. PATENT DOCUMENTS

| | | | |
|---|---|---|---|
| 2018/0175265 A1 | 6/2018 | Kim et al. | |
| 2018/0319127 A1* | 11/2018 | Katami | C09J 11/04 |
| 2020/0241189 A1* | 7/2020 | Schabacker | B60Q 3/208 |

* cited by examiner

COMPONENT WITH A REFLECTIVE HOUSING AND METHOD FOR PRODUCING SUCH A COMPONENT

This application is a 35 U.S.C. § 371 National Phase of PCT Application No. PCT/EP2019/082904, filed Nov. 28, 2019, which claims priority to German Application No. 10 2018 130 526.5, filed Nov. 30, 2018, the disclosures of which are hereby incorporated by reference herein in their entireties.

A component with a reflective housing is specified. Furthermore, a method for producing such a component is specified.

A task to be solved is to specify a component whose housing comprises a high reflectivity for visible light.

This task is solved, inter alia, by a component and by a production method with the features of the independent claims. Preferred further developments are the subject of the dependent claims.

According to at least one embodiment, the component comprises a reflective housing. Reflective means in particular that a reflectance for visible light is at least 90%. Preferably, this reflectance is present over the entire visible spectral range, but at least for one or more specific wavelengths from the visible spectral range. In the present case, the visible spectral range refers to wavelengths between 400 nm and 720 nm inclusive. In particular, the housing appears white to an observer and is thus diffusely reflective.

According to at least one embodiment, the housing comprises a matrix material. The matrix material is, for example, a plastic, preferably a light-transmissive plastic. That is, the matrix material may be transparent to the radiation to be reflected.

According to at least one embodiment, the housing comprises particles. The particles are embedded in the matrix material. Due to the matrix material, the particles are mechanically firmly and permanently connected to each other. The particles are made of at least one glass ceramic.

According to at least one embodiment, the particles comprise a comparatively large mean diameter. Comparatively large mean diameter means, in particular, that the diameter is at least twice or at least 5 times a wavelength of maximum intensity of the radiation to be reflected. In other words, the particles are large compared to the wavelength to be reflected. In particular, the mean diameter of the particles is at least 5 µm or at least 10 µm. Alternatively or additionally, the mean diameter is at most 100 µm or at most 60 µm or at most 40 µm or at most 30 µm.

For example, the mean diameter is a median value. That is, 50% of the particles comprise a smaller diameter and 50% of the particles comprise a larger diameter than the mean diameter. The mean diameter can be measured, for example, using sieves with suitable mesh sizes or with suitable pore sizes.

According to at least one embodiment, the particles comprise a glass matrix. The glass matrix of the particles may be of a glass that is transparent to the radiation to be reflected. In particular, glass means that the material of the glass matrix is amorphous.

According to at least one embodiment, the particles comprise crystallites. The crystallites are preferably embedded in the glass matrix. The crystallites may be firmly bonded to one another by the glass matrix and/or at least partially intergrown.

According to at least one embodiment, a refractive index difference between the glass matrix and the crystallites is at least 0.3 or at least 0.5 or at least 0.7. That is, the crystallites comprise a relatively large refractive index and the glass matrix comprises a relatively small refractive index. Thus, the crystallites are of a material having a high refractive index.

Preferably, the matrix material of the housing also comprises a large refractive index difference to the crystallites and/or the glass matrix. Preferably, a refractive index difference between the matrix material and the glass matrix is at least 0.1 or at least 0.2 or at least 0.3, where the refractive index of the glass matrix is greater than that of the matrix material.

Alternatively, the refractive indices of the glass matrix and the matrix material may be matched. This means that the refractive indices differ from each other by at most 0.1 or by at most 0.05.

In particular, the refractive index difference is determined at a temperature of 300 K and at a wavelength of 530 nm.

According to at least one embodiment, the crystallites are small. In particular, a mean diameter of the crystallites is at most 1 µm, ideally at most 0.3 µm or 0.5 µm. Backscattering due to diffuse scattering is desired. Alternatively or additionally, the crystallites comprise a mean diameter of at least 10 nm or at least 20 nm or at least 50 nm. As with the particles, the mean diameter of the crystallites may be a median value.

In at least one embodiment, the component comprises a light reflective housing. The housing comprises a matrix material of a light-transmissive plastic and particles of a glass ceramic embedded therein. The particles comprise a mean diameter of at least 5 µm. The particles comprise a glass matrix and crystallites contained therein. A refractive index difference between the glass matrix and the crystallites is at least 0.5 at a temperature of 300 K and at a wavelength of 530 nm. The crystallites preferably exhibit a mean diameter between 20 nm and 0.2 µm inclusive, or between 20 nm and 0.5 µm, or between 20 nm and 1 µm.

The housing of the component described herein is formed with high reflectivity in particular by filling a plastic, such as an epoxy resin or a silicone, with glass ceramic particles.

Conventional epoxy components produced by an injection molding technique or a compression molding technique can comprise various fillers. Glass beads are frequently used as fillers. However, the reflectivity of glass beads in an epoxy is comparatively low, since glass is generally a homogeneous, amorphous and transparent material for light.

When a glass ceramic is used as a substitute for glass beads specifically in epoxy components produced by injection and/or by pressing, the properties relevant for processing the material with regard to the flow behavior of the compound material during molding hardly change, since a geometry of the filler can essentially be retained. In addition, the coefficient of thermal expansion of glass ceramics can be adjusted so that the mechanical properties of components made from a corresponding compound material can be maintained or improved.

By treating the material appropriately, a glass ceramic allows crystal growth, in particular of titanium dioxide, using $ZrO_2$ as a crystallization germ with a size efficient for reflecting light, for example in the range below 300 nm. Moreover, very thin housings can be realized by a simple modification of the particle sizes, especially the sphere sizes of the glass ceramic. In addition, the use of a glass ceramic allows targeted adjustment of the refractive index of the glass phase as well as the coefficient of thermal expansion.

Thus, in the case of the housing described here, improved reflectivities are provided with essentially unchanged material processability. Adjustment of the refractive index of the glass matrix is possible. In addition, precipitates in the form of the crystallites can be produced in desired sizes, especially in the nanometer and submicrometer ranges. Thus, crystallites made of highly reflective materials such as titanium dioxide are possible.

According to at least one embodiment, the crystallites comprise one or more of the following materials or consist of one or more of these materials: $TiO_2$, $ZrO_2$, $TeO_2$, $HfO_2$, ZnO, $Ta_2O_5$, $Nb_2O_5$, $La_2O_3$, $V_2O_5$, in particular of $TiO_2$ and/or $ZrO_2$. The individual crystallites are preferably each made of only one material or of two materials if a second material, in particular $ZrO_2$, is required as a crystallization germ. However, crystallites of different materials may be present in the particles and in the glass ceramic in combination with each other and side by side. The crystals can either be generated by precipitation from the matrix or are already present as crystallite in the matrix.

According to at least one embodiment, at least a portion of the crystallites is of $ZrO_2$. For example, the portion of the crystallites that are of zirconium dioxide is at least 0.5% or at least 10% or at least 20% or at least 40%. In particular, zirconium dioxide crystallites may be present in combination with titanium dioxide crystallites. A mean diameter of these crystallites is preferably at most 500 nm or at most 300 nm or at most 150 nm.

According to at least one embodiment, $ZrO_2$ is present in addition to $TOO_2$ if $ZrO_2$ is used as a crystallization germ for the production of the glass ceramic. The concentration and/or a weight fraction of $ZrO_2$ is then preferably at most 0.5% or at most 1% or at most 5%.

According to at least one embodiment, the glass matrix of the particles comprises or consists of one or more of the following materials: $SiO_2$, $Al_2O_3$, CaO, BaO, MgO, $Na_2O$, $K_2O$, $TeO_2$, $GeO_2$, $MnO_2$, $Ag_2O$, $Li_2O$, $B_2O_3$, $Fe_2O_3$, CuO, SrO, $MoO_3$, $As_2O_3$, $Y_2O_3$, $Yb_2O_3$, $Cr_2O_3$, $P_2O_5$, $Sb_2O_5$. The glass matrices of different particles may comprise the same or different material compositions. Preferably, however, the glass matrices of the different particles each comprise the same material composition within the manufacturing tolerances, so that there are no selective gradients in the material composition of the glass matrices. In particular, the glass matrices are optically inactive with respect to the matrix material of the compound material, which is, for example, an epoxy resin or a silicone and into which the glass ceramic has been added.

According to at least one embodiment, the matrix material of the housing is a silicone, an epoxy, or a silicone-epoxy hybrid material. As an alternative to silicones and/or epoxies, other plastics may be used, for example polymethylmetacrylate, PMMA for short, or polycarbonates, PC for short. Since the matrix material used can come into contact with radiation to be reflected at least at one edge or outer surfaces of the housing, the matrix material is preferably photostable with respect to the radiation to be reflected.

According to at least one embodiment, the particles comprise a comparatively large weight fraction of the housing. To determine the weight fraction, only the matrix material and the particles of the housing are preferably taken into account. The same applies accordingly to the determination of a volume fraction.

According to at least one embodiment, the weight fraction of the particles on the housing is at least 20% or at least 30% or at least 40% or at least 60%. Alternatively or additionally, this weight fraction is at most 90% or at most 75%.

According to at least one embodiment, a volume fraction of the particles on the housing is at least 15% or at least 30% or at least 40%. Alternatively or additionally, the volume fraction is at most 80% or at most 70% or at most 50%. Volume fractions above the densest sphere packing for particles of only a certain size are achievable by selectively using particles with a comparatively large particle diameter distribution.

According to at least one embodiment, the volume fraction of crystallites in the particles is relatively large. Preferably, the proportion of crystallites to the particles is at least 25% or at least 35%. Alternatively or additionally, this proportion is at most 95% or at most 75% or at most 60%. The proportion of crystallites here refers in particular to a volume fraction or to an area fraction in a sectional view, but can alternatively also refer to a weight fraction.

According to at least one embodiment, the particles comprise a comparatively large diameter distribution. In particular, at least 75% of the particles comprise a diameter between 5 µm and 90 µm, inclusive, or between 20 µm and 60 µm, inclusive. The particle diameters can be determined, for example, by a sieving method, a sedimentation analysis or a microscopic analysis or other suitable methods.

In this constellation, preferably at least 20% or at least 30% or at least 40% of the particles comprise a diameter of at most 30 µm or 20 µm. Alternatively or additionally, at least 20% or at least 25% or at least 30% of the particles comprise a diameter of at least 50 µm or at least 60 µm or at least 40 µm. In other words, a large proportion of the particles comprise relatively small diameters and another large proportion of the particles comprise relatively large diameters, and only a few particles have diameters around the median or mean diameter across all particles. Thus, a particularly dense packing and a particularly high volume fraction of the particles on the housing can be achieved.

According to at least one embodiment, further particles are present in the matrix material, in particular a silicone or an epoxy, if these are required, for example to improve the mechanical and or thermal properties, or for other reasons.

These may be ceramic materials, glasses or others with or without reflective coatings.

According to at least one embodiment, a mean thickness of the housing is small in a direction perpendicular to a mounting side of the component. In particular, this refers to a mean diameter of the particles. For example, the mean thickness of the housing in the direction perpendicular to the mounting side is at least 3 times or at least 5 times and/or at most 30 times or at most 20 times the mean diameter of the particles. Thus, the housing may comprise thicknesses in the range of less than 10 µm to a few 100 µm while ensuring high reflectivity.

According to at least one embodiment, the component comprises one or more semiconductor chips. The at least one semiconductor chip is preferably a light emitting diode chip, a laser diode chip, or a photodetector chip. Several different types of semiconductor chips may be combined.

The at least one semiconductor chip is located in one or more recesses of the housing. Preferably, all semiconductor chips are located in a single recess of the housing. Alternatively, individual semiconductor chips or groups of semiconductor chips are located in separate recesses.

According to at least one embodiment, the at least one light emitting diode chip or laser diode chip is configured to generate near-ultraviolet or visible radiation. A reflectance of the housing for the generated radiation is at least 90%.

According to at least one embodiment, the light emitting diode chip or laser diode chip comprises a semiconductor layer sequence. The semiconductor layer sequence is configured to generate the radiation. The semiconductor layer sequence is preferably based on a III-V compound semiconductor material. For example, the semiconductor material is a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, wherein in each case $0 \leq n \leq 1$, $0 \leq m \leq 1$ and $n+m \leq 1$ as well as $0 \leq k < 1$. Preferably, for at least one layer or for all layers of the semiconductor layer sequence, $0 < n \leq 0.8$, $0.4 \leq m < 1$ and $n+m \leq 0.95$ as well as $0 < k \leq 0.5$. In this context, the semiconductor layer sequence may comprise dopants as well as additional components. However, for simplicity, only the essential constituents of the crystal lattice of the semiconductor layer sequence, i.e., Al, As, Ga, In, N, or P, are specified, even though these may be partially replaced and/or supplemented by small amounts of additional substances.

According to at least one embodiment, the component comprises at least one phosphor. The phosphor or phosphors are arranged downstream of the at least one light-emitting diode chip or laser diode chip along a radiation direction. The values for the reflectivity of the housing mentioned for the light-emitting diode chip and for the laser diode chip preferably apply accordingly to the light generated by the phosphor.

The at least one phosphor is preferably selected from the following group: $Eu^{2-}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2-}$; garnets from the general system $(Gd,Lu,Tb,Y)_3(Al,Ga,D)_5(O,X)_{12}:RE$ with X=halide, N or divalent element, D=trivalent or tetravalent element, and RE=rare earth metals such as $Lu_3(Al_{1-x}Ga_x)_5O_{12}:Ce^{3+}$, $Y_3(Al_{1-x}Ga_x)_5O_{12}:Ce^{3-}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs such as from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$ with RE=rare earth metals; nitrido-orthosilicates such as $AE_{2-x-a}RE_xEu_aSiO_{4-x}N_x$ or $AE_{2-x-a}RE_xEu_aSi_{1-y}O_{4-x-2y}N_x$ where RE=rare earth metal and AE=alkaline earth metal or such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM phosphors from the BaO—MgO—$Al_2O_3$ system such as $BaMgAl_{10}O_{17}:Eu^{2+}$; halophosphates such as $M_5(PO_4)_3(Cl,F):(Eu^{2+},Sb^{2+},Mn^{2+})$; SCAP phosphors such as $(Sr,Ba,Ca)_5(PO_4)_3Cl:Eu^{2+}$; KSF phosphors based on potassium, silicon and fluorine such as $K_2SiF_6:Mn^{4+}$. In addition, so-called quantum dots can also be brought in as a converter material. Quantum dots in the form of nanocrystalline materials containing a group II-VI compound and/or a group III-V compound and/or a group IV-VI compound and/or metal nanocrystals are preferred here. Further, the phosphor may comprise a quantum well structure and may be epitaxially grown.

According to at least one embodiment, the phosphor is arranged spaced apart from the housing. That is, the phosphor and the housing are not touching each other. Alternatively, the phosphor and the housing may also touch in places. This is the case, for example, if the phosphor is added to a potting that fills the recess with the semiconductor chip.

According to at least one embodiment, a total thickness of the housing with a tolerance of at most 20 μm or at most 10 μm or at most 5 μm is equal to the thickness of the semiconductor chip or to the thickness of the semiconductor chip together with the phosphor. Thus, a frame may be formed by the housing around the semiconductor chip, optionally together with the corresponding phosphor. Furthermore, very thin components are achievable, the thickness of which is limited to the total thickness of the phosphor together with the semiconductor chip.

According to at least one embodiment, the phosphor and the semiconductor chip are arranged stacked on top of each other. In particular, the phosphor and the semiconductor chip may be arranged congruently on top of each other. Optionally, the phosphor comprises a cutout for a bonding wire. Optionally, the phosphor covers the side wall and/or the surface of the chip.

According to at least one embodiment, the matrix material of the housing contacts the phosphor in places. It is possible that side surfaces of the semiconductor chip and optionally of the phosphor are completely and directly covered by the housing and thus the matrix material, also together with the particles.

According to at least one embodiment, a light exit side of the light emitting diode chip, the laser diode chip and/or the phosphor is free of the matrix material and thus also free of the particles. Thus, a high light output is achievable.

According to at least one embodiment, a specific thermal conductivity of the particles is higher than a specific thermal conductivity of the matrix material by at least a factor of 5 or by at least a factor of 10. Thus, a high thermal conductivity of the housing as a whole can be achieved via the particles. This is especially true if the particles are present percolated. If the particles are present percolated, continuous and/or connected thermal conduction paths are formed by the particles in the matrix material.

Furthermore, a method for producing such components is specified. Features of the producing method are therefore also disclosed for the components and vice versa.

In at least one embodiment, the method for producing comprises the following steps, preferably in the order indicated:

Providing a glass or a glass ceramic which already contains crystallites, since these may not form a melt during production due to a lack of solubility, carrying out a temperature treatment of the glass so that a glass ceramic is formed, optionally comminution the glass ceramic to the particles or alternatively optionally comminution the glass to the desired shape already before the temperature treatment or alternatively producing the glass already in the desired shape, and/or rounding the comminuted particles by a suitable temperature treatment of the particles before carrying out the temperature treatment to produce the crystallites by precipitation from the matrix with or without the use of crystallization germs; alternatively, the material can also be obtained from a sol-gel process and converted to the desired state by mechanical and/or thermal post-treatments, adding the particles to the matrix material so that a molding mass is formed, and filling a mold with the molding mass by means of casting, injection and/or pressing, and subsequently curing to form the housing.

As an alternative to comminution the glass ceramic into the particles, the glass can already be provided in the desired size. Thus, the comminution may already be given before the temperature treatment is carried out, for example by plasma spray pyrolysis or spray pyrolysis. Comminution can be performed by fritting and grinding as an alternative to spray pyrolysis, if necessary. Rounding of the particles may be accomplished by brief melting.

Curing to the housing may be thermal or even photochemical crosslinking, or may be achieved by cooling.

According to at least one embodiment, the glass is an aluminosilicate glass. The aluminosilicate glass is made from the following starting materials or the starting materials comprise the following materials:

$SiO_2$ with a weight fraction between 15% and 50% inclusive or between 20% and 40% inclusive, $Al_2O_3$ with a weight fraction between 2% and 30% inclusive or between 10% and 20% inclusive, $TiO_2$ in a weight fraction between 20% and 40% inclusive, or between 20% and 35% inclusive, or between 0% and 40% inclusive, $ZrO_2$ in a weight fraction between 0.5% and 20% inclusice, or between 0.5% and 10% inclusive, or between 0.5% and 40% inclusive, and Alkali oxides and alkaline earth oxides with a weight fraction of at most 15% or at most 10% or at most 5%.

According to at least one embodiment of the method, the temperature treatment of the glass to produce the glass ceramic is carried out temporarily or permanently at a temperature which is at least 105% or at least 110% of a glass transition temperature of the glass. Alternatively or additionally, this temperature is at most 150% or at most 135% or at most 125% of the glass transition temperature. The glass transition temperature is to be specified in K. In other words, the glass ceramic is formed by relatively moderate heating of the glass. This heating allows crystallization to occur to form the crystallites.

Preferably, the elevated temperature is applied for only a comparatively short time. For example, the elevated temperature is applied for at least 0.25 h or at least 0.5 h and/or for at most 10 h or at most 5 h. This short period of elevated temperature allows comparatively small crystallites to be achieved.

It is possible that comparatively steep temperature ramps are carried out to reach the elevated temperature and/or to cool down from the elevated temperature. That is, the glass is heated rapidly and the glass ceramic is cooled rapidly. For example, the temperature ramps comprise a gradient of at least 500 K/h or of at least 1000 K/h and/or of at most 3000 K/h or of at most 1500 K/h.

According to a further embodiment, a temperature treatment of the glass is not necessary to generate the crystallites, since they are already present, having not been converted into a melt. In this case, the glass ceramic is produced directly from, in particular, powdered starting materials, preferably without an intermediate step via a glass.

In the following, a component described here and a method described here are explained in more detail with reference to the drawings using exemplary embodiments. Identical reference signs specify identical elements in the individual figures. However, no references to scale are shown; rather, individual elements may be shown in exaggerated size for better understanding.

In the figures:

FIGS. 1 to 6 show a production process for components 1. The finished components 1 are preferably semiconductor devices such as light-emitting diodes, or LEDs for short.

Figure 1:
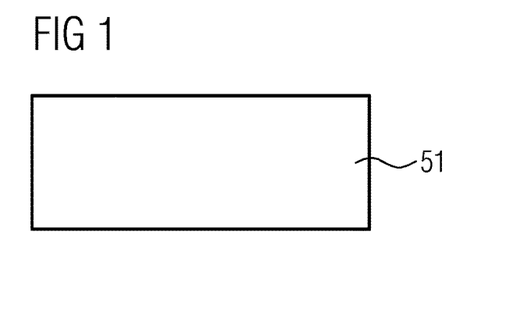
FIG. 1 shows a schematic sectional view of a method step for treating a glass for the production of components described here.

In FIG. 1 it is illustrated that a glass 51 is provided. The glass 51 is preferably an aluminosilicate glass. The starting material for the glass 51 is titanium dioxide in the highest possible weight fraction. For example, the weight fraction of titanium dioxide is around 30% when weighed in. Further constituents of the glass 1 are, with respect to the initial weight, preferably silicon dioxide with a weight fraction of about 30% as well as aluminum oxide, for example with a weight fraction of about 20% or about 10% or about 5%. Zirconium dioxide is used with a weight fraction with respect to the initial weight of approximately 10% or only 1%. The remaining components, which make up only a relatively small weight fraction of the starting materials, are formed by alkali oxides and by alkaline earth oxides.

The glass 51 is produced in particular by mixing the starting materials together, wherein the starting materials may be in the form of fine granules or powders. Subsequently, a temperature treatment is carried out at a relatively high temperature, for example at a temperature of at least 1400 K and/or of at most 1800 K. Subsequently, cooling to the glass 51 takes place. A glass transition temperature of the finished glass 51 is, for example, around 1100 K.

Figure 2:
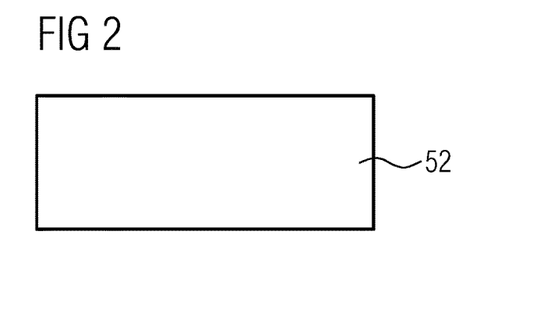
FIG. 2 shows a schematic sectional view of a method step for treating a glass ceramic for components described here.

In the step of FIG. 2, it is illustrated that the glass ceramic 52 is obtained from the glass 51. For this purpose, the glass 51 of FIG. 1 is raised relatively rapidly to a temperature which is, for example, about 10% above the glass transition temperature of the glass 51. This results in the growth of crystallites 32 which remain in an amorphous glass matrix 31. The final glass ceramic 52 may be a glass ceramic frit or glass ceramic spheres previously formed from the melt by an alternative forming process, such as spray pyrolysis.

Figure 3:
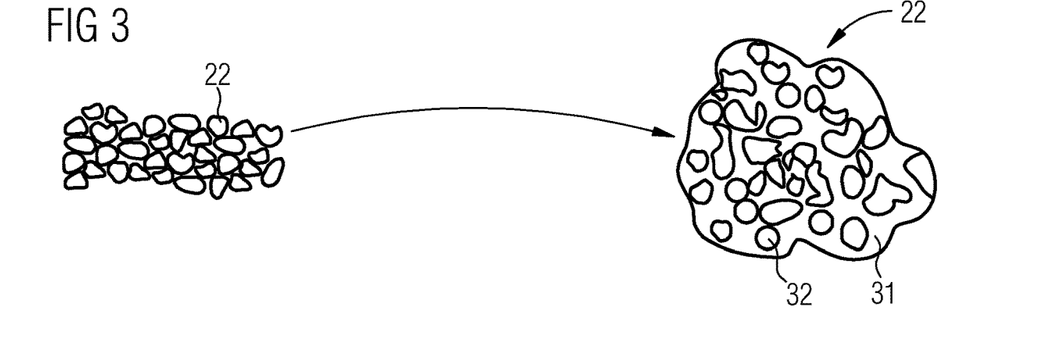
FIG. 3 shows a schematic sectional view of a method step for generating particles for components described here.
Figure 4:
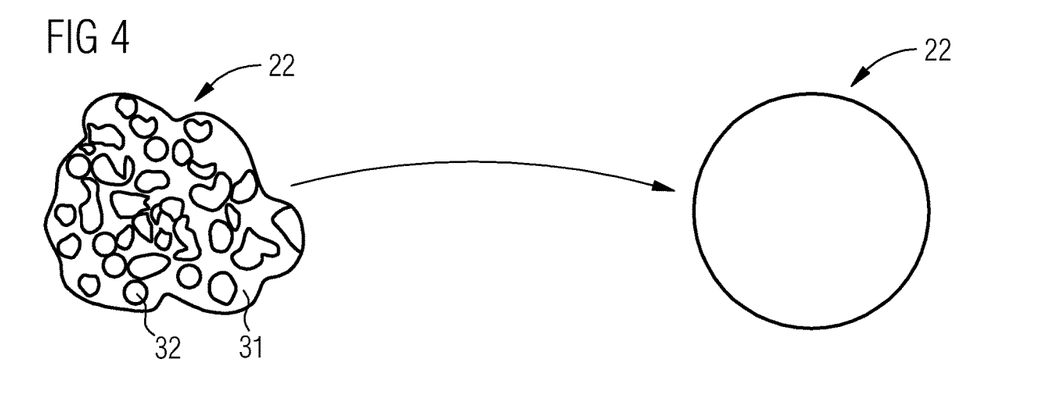
FIG. 4 shows a schematic sectional view of a method step for generating particles for components described here.

According to the optional step of FIG. 3, left side, the glass ceramic 52 of FIG. 2 is comminuted. Thus, a plurality of particles 22 is obtained from the glass ceramic 52. The glass ceramic particles 22 comprise, for example, a mean diameter around 40 µm. Thereby, the glass ceramic particles 22 can exhibit a comparatively large distribution of diameters.

In FIG. 3, right side, one of the glass ceramic particles 22 is shown in detail in a schematic sectional view. The particle 22 includes the glass matrix 31 as well as many of the crystallites 32 located within the glass matrix 32. The particle 22 may be approximately spherical in shape or may comprise a comparatively irregular outer surface. A diameter of the crystallites 32 is much smaller than a diameter of the particle 22.

The crystallites 32 are present in a concentration as high as possible in the glass matrix. The crystallites 32 are as small as possible on average, for example with a mean diameter of at most 0.2 µm or of at most 0.5 µm. There is preferably a high refractive index difference between the glass matrix 31 and the crystallites 32, so that due to the crystallites 32 the particle 22 is highly reflective and preferably appears white. The crystallites 32 are preferably made of titanium dioxide as well as zirconium dioxide. Preferably, only one material is present per crystallite 32. In the case of $TiO_2$, $ZrO_2$ is particularly preferably additionally present as a nucleating agent if the material is produced by thermal crystal growth. However, titanium dioxide crystallites and zirconium dioxide crystallites can also be present mixed in the glass matrix 31 of the particle 22.

The comminution, the result of which is shown in FIG. 3, does not typically result in spherical particles 22. Therefore, in the optional step of FIG. 4, it is shown that the comparatively irregularly shaped particles 22 obtained from the step of FIG. 3 are transformed into spherical or nearly spherical particles 22. Nearly spherical means, for example, that an aspect ratio of a length and a diameter of the particles 22 is between 0.7 and 2, inclusive, or between 0.75 and 1.25, inclusive, and/or that a surface roughness of the particles 22 is at most 20% or at most 5% of a mean diameter of the particles 22.

Such a rounding of the particles 22 is possible, for example, by a temperature treatment, such as a short-time melting or fusing of the particles 22, or by etching. By such a rounding of the particles 22, an improved processability of a molding mass 53 with the particles 22 can be ensured, in particular in the step of FIG. 5.

As an alternative to the step of FIG. 3 or to the steps of FIGS. 1 to 3, the glass 51 can already be produced in the desired shape or can be brought into the desired shape before the temperature treatment of the step of FIG. 2. For example, this is done by using plasma spray pyrolysis. That is, the comminution into the desired shape, for the production of the spherical structures of a certain size or a certain size distribution, is thus omitted.

Figure 5:
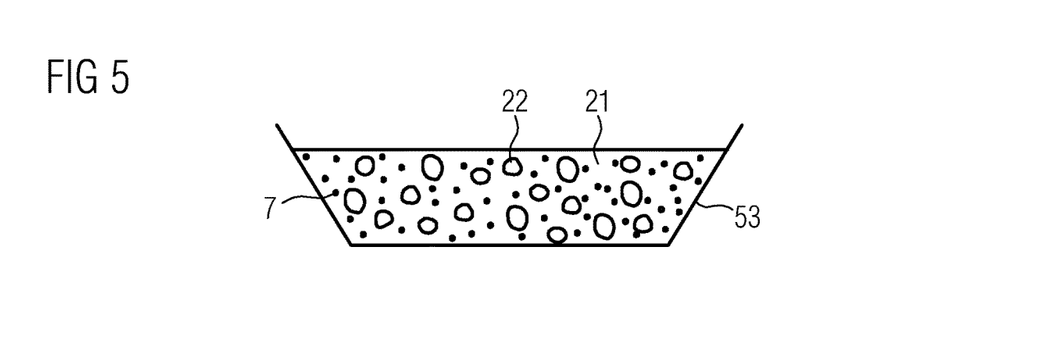
FIG. 5 shows a schematic sectional view of a method step for producing a molding mass for components described here.

In the step of FIG. 5, it is illustrated that the glass ceramic particles 22 are mixed into a matrix material 21. The matrix material 21 is preferably a silicone or an epoxy. A weight fraction of the particles 22 in the material mixture forming a molding mass 53 is, for example, around 65%.

Furthermore, it is shown in FIG. 5 that further particles 7 may be present, as is also possible in all other exemplary embodiments. The further particles 7 can be used to further adjust the mechanical, thermal and/or optical properties of the housing 2. Several different types of further particles 7 may be present. The further particles 7 may optionally be provided with a reflective coating. A mean diameter of the further particles 7 is preferably smaller than the mean diameter of the glass ceramic particles 22, but may alternatively be equal to or larger than the mean diameter of the glass ceramic particles 22.

Figure 6:
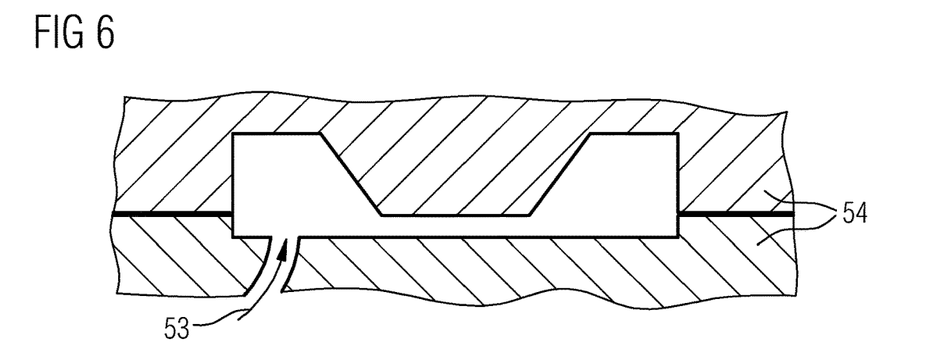
FIG. 6 shows a schematic sectional view of a method step for producing a housing for components described here.

In the method step of FIG. 6, a mold 54 is provided, for example in two parts. The molding mass 53 is preferably filled into a cavity of the mold 54 in a heated state. After thermal curing or cooling, a housing 2 is formed in the cavity of the mold 54, not shown in FIG. 6.

Deviating from the illustration in FIG. 6, the housing 2 can also be produced by casting. Furthermore, it is possible that a film assisted molding or injection molding is carried out, also referred to as FAM for short.

Figure 7:
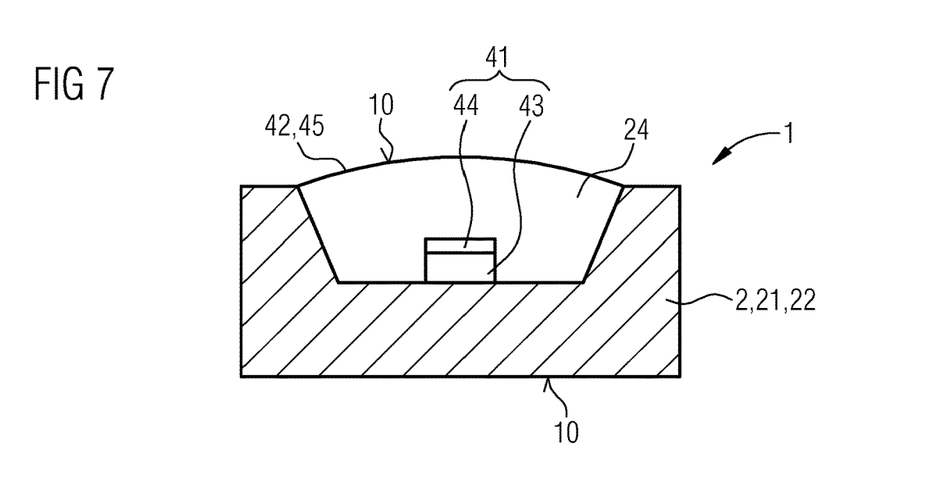
FIGS. 7 to 12 show schematic sectional views of exemplary embodiments of components described herein.

FIG. 7 illustrates an example of a component 1 comprising such a housing 2. The housing 2 is composed of matrix material 21 and particles 22.

Preferably, the housing comprises a recess 24. In the recess 24 a semiconductor chip, preferably a light emitting diode chip 41 is arranged. The light emitting diode chip 41 is composed of a substrate 43 and of a semiconductor layer sequence 44. The substrate 43 is, for example, a sapphire substrate. The semiconductor layer sequence 44 may be a layer sequence of AlInGaN materials. Deviating from the illustration of FIG. 7, it is possible that the semiconductor layer sequence 44 is located closer to the housing 2 than the substrate 43.

Optionally, the recess 24 is filled with a potting 45. The potting 45 is preferably made of a transparent material such as a silicone. The potting 45 may optionally comprise at least one phosphor 42, which may be present in the form of dispersed or sedimented particles. For example, the potting 45 is lenticular in shape.

Figure 8:
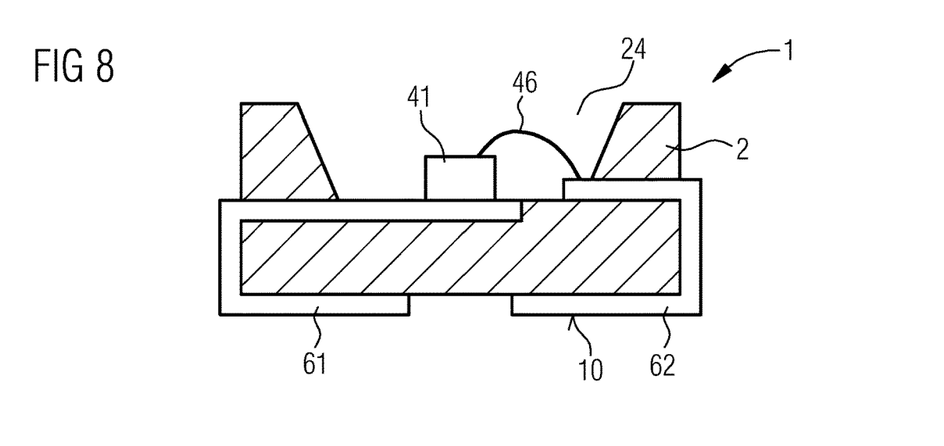

FIG. 8 illustrates another exemplary embodiment of the component 1. Here, a first lead frame part 61 and a second lead frame part 62 are integrated in the housing 2. The light emitting diode chip 41 is mounted on the first lead frame part 61. An electrical connection to the second lead frame part 62 is achieved via a bonding wire 46.

The lead frame parts 61, 62 may be located in a common plane in the housing 2, wherein the semiconductor chip 41 is mounted on this plane. Subsequently, the lead frame parts 61, 62 are guided out of the housing 2 and brought to a mounting side 10, for example via bending.

The potting 45 and/or the phosphor 42 of FIG. 7 may also be present in the exemplary embodiment of FIG. 8.

Such designs, as illustrated in FIGS. 7 and 8, are also referred to as prefabricated housing designs or premold components.

Figure 9:
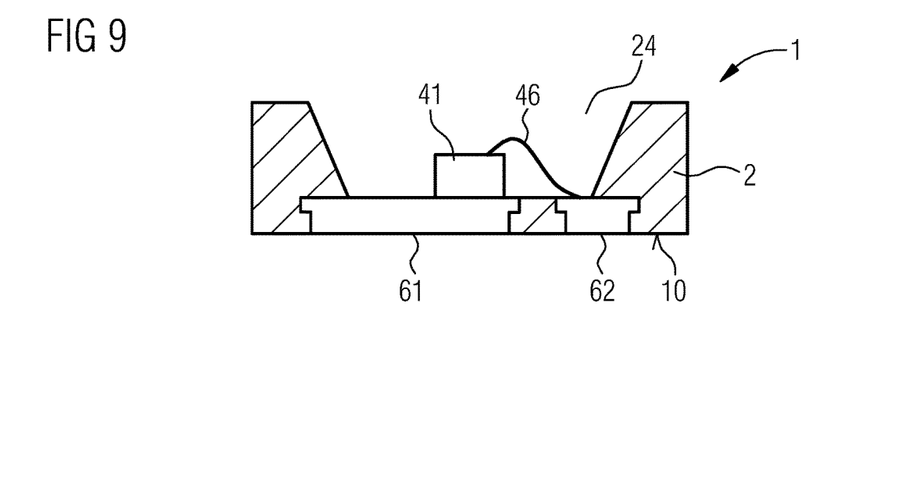

The component 1 of FIG. 9 is a so-called QFN component, wherein QFN stands for Quad Flat No Leads. The light emitting diode chip 41 is deposited on a first metal part 61 and optionally electrically connected to a second metal part 62 via the bonding wire 46. The metal parts 61, 62 are preferably formed by flat metal plates, for example made of copper, which are preferably flush with the housing 2 at the mounting side 10.

Optionally, the metal parts 61, 62 may comprise protrusions or structuring as seen in cross-section in order to achieve an improved mechanical connection between the housing 2 and the metal parts 61, 62.

Figure 10:
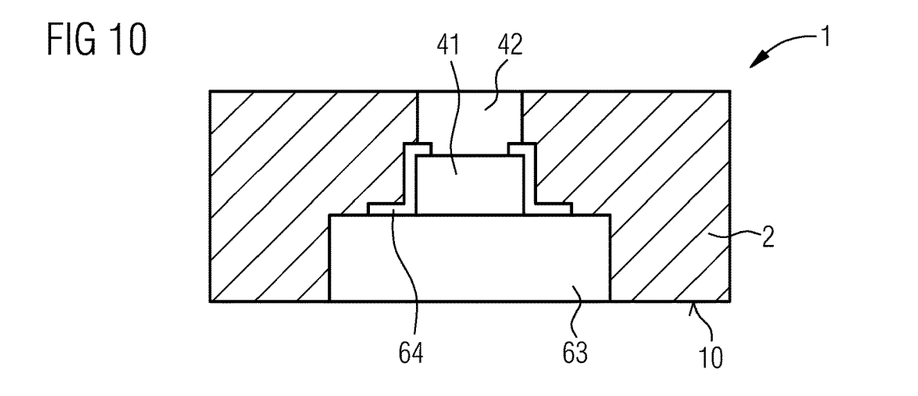

In the exemplary embodiment of FIG. 10, the light emitting diode chip 41 is mounted on a carrier 63. The carrier 63 is, for example, a printed circuit board such as a ceramic substrate provided with conductor tracks, or also a printed circuit board based on a plastic or a metal core board.

It is possible that the semiconductor chip 41 is electrically contacted without bonding wires. For this purpose, electrical conductor tracks 64 can be guided from the carrier 63 via chip flanks to a light exit side of the light emitting diode chip 41 facing away from the carrier 63.

Optionally, the phosphor 42 is located on the light exit side of the light emitting diode chip 41. The phosphor 42 is, for example, a silicone platelet or a ceramic platelet with at least one luminescent substance.

The housing 2 is formed directly on side surfaces of the carrier 63, the light-emitting diode chip 41, and the phosphor 42. A thickness of the housing 2 is equal to the sum of the thicknesses of the carrier 63 together with the light emitting diode chip 41 and the phosphor 42, wherein any bonding agents such as adhesives or solders that do not significantly contribute to the thickness are neglected.

Figure 11:
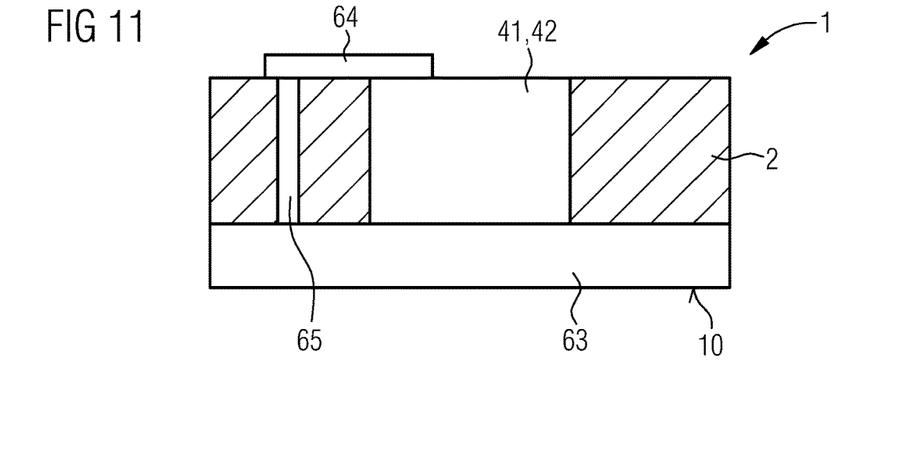

In FIG. 11, it is shown that the carrier 63 of the component 1 extends completely over the lateral extent of the component 1. The light emitting diode chip 41 and the optional phosphor 42 are attached to an upper side of the carrier 63 and are surrounded laterally all around by the housing 2.

An electrical contacting of the semiconductor chip 41 takes place, on the one hand, directly towards the carrier 63 and, on the other hand, via an electrical conductor track 64. The conductor track 64 runs on an upper side of the housing 2 facing away from the carrier 63. An electrical contacting of the conductor track 64 towards the carrier 63 is provided by an electrical through-connection 65.

Figure 12:
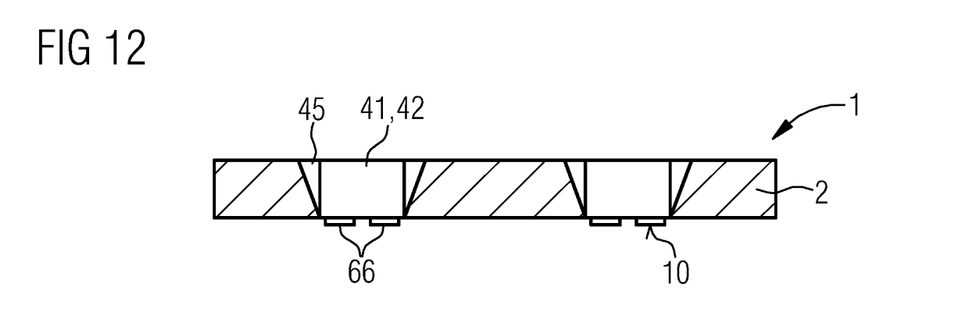

In the exemplary embodiment of component 1 of FIG. 12, it is shown that several of the light-emitting diode chips 41 are present, wherein in each case a phosphor 42 can optionally be present in addition. The housing 2 comprises a separate recess for each light emitting diode chip 41.

The component 1 of FIG. 12 is free of an additional carrier. This means that electrical contacting of the light emitting diode chips 41 can take place directly via electrical contact pads 66 of the light emitting diode chips 41. Mechanical stabilization is achieved via the housing 2 itself. A thickness of the housing 2 is equal to a thickness of the light-emitting diode chips 41 together with the optional phosphor 42. This allows compact, thin components 1 to be realized.

Optionally, side surfaces of the light emitting diode chip 41 are surrounded by a potting 45. The potting 45 is preferably transparent, for example made of a silicone. In the direction away from the mounting side 10, the potting 45 may widen as seen in cross-section.

Unless otherwise indicated, the components shown in the figures preferably follow each other directly in the sequence indicated. Layers not touching in the figures are preferably spaced apart. Insofar as lines are drawn parallel to each other, the corresponding surfaces are preferably also aligned parallel to each other. Likewise, unless otherwise indicated, the relative positions of the drawn components to each other are correctly reproduced in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

This patent application claims priority to German patent application 10 2018 130 526.5, the disclosure content of which is hereby incorporated by reference.

REFERENCES 1 component
10 mounting side
2 housing
21 matrix material
222 particles
24 recess
31 glass matrix
32 crystallite
41 semiconductor chip/light emitting diode chip
42 phosphor
43 substrate
44 semiconductor layer sequence
45 potting
46 bonding wire
51 glass
52 glass ceramic
53 molding mass
54 mold
61 first lead frame part
62 second lead frame part
63 carrier
64 conductor track
65 through-connection
66 contact pad
7 further particles

The invention claimed is:

1. A component with a light-reflecting housing, wherein
the housing comprises a matrix material of a light-transmissive plastic and particles of a glass ceramic embedded therein,
the particles comprise a mean diameter of at least 5 μm,
the particles comprise a glass matrix and crystallites
a refractive index difference between the glass matrix and the crystallites is at least 0.5 at a temperature of 300 K and at a wavelength of 530 nm, and
the crystallites have a mean diameter of between 20 nm and 0.5 μm inclusive.

2. The component according to claim 1, wherein
the housing is white,
the crystallites comprise or consist of at least one of the following materials: $TiO_2$, $ZrO_2$, $TeO_2$, $HfO_2$, $ZnO$, $Ta_2O_5$, $Nb_2O_5$, $La_2O_3$, $V_2O_5$, and
the glass matrix comprises at least one of the following materials or consists of at least one of these materials: $SiO_2$, $Al_2O_3$, $CaO$, $BaO$, $MgO$, $Na_2O$, $K_2O$, $TeO_2$, $GeO_2$, $MnO_2$, $Ag_2O$, $Li_2O$, $B_2O_3$, $Fe_2O_3$, $CuO$, $SrO$, $MoO_3$, $As_2O_3$, $Y_2O_3$, $Yb_2O_3$, $Cr_2O_3$, $P_2O_5$, $Sb_2O_5$.

3. The component according to claim 1,
wherein at least a part of the crystallites is of $ZrO_2$,
wherein a mean diameter of these crystallites is at most 300 nm.

4. The component according to claim 1,
wherein at least a part of the crystallites is of $TiO_2$,
wherein a mean diameter of these crystallites is at most 300 nm.

5. The component according to claim 1,
wherein the matrix material is a silicone, an epoxy or a silicone-epoxy hybrid material,
wherein a weight fraction of the particles on the housing is between 40% and 85% inclusive, and
wherein a volume fraction of the particles on the housing is between 20% and 70%, inclusive.

6. The component according to claim 1,
wherein a proportion of the crystallites to the particles is between 25% and 75% inclusive.

7. The component according to claim 1,
wherein at least 75% of the particles comprise a diameter between 5 μm and 90 μm, inclusive,
wherein at least 30% of the particles comprise a diameter of 30 μm or less, and at least 25% of the particles comprise a diameter of 30 μm or more.

8. The component according to claim 1,
wherein a mean thickness of the housing in a direction perpendicular to a mounting side of the component is between three times and thirty times, inclusive, the mean diameter of the particles.

9. The component according to claim 1,
further comprising at least one light emitting diode chip mounted in at least one recess of the housing,
wherein the light emitting diode chip is configured to generate visible light and a reflectance of the housing for this light is at least 90%.

10. The component according to claim 9,
further comprising at least one phosphor arranged downstream of the light emitting diode chip along an emission direction,
wherein the phosphor is arranged spaced apart from the housing.

11. The component according to claim 9,
wherein a total thickness of the housing with a tolerance of at most 10 µm is equal to a thickness of the light emitting diode chip together with the phosphor,
wherein the phosphor and the light emitting diode chip are arranged stacked on top of each other.

12. The component according to claim 9,
wherein the matrix material contacts the light emitting diode chip in places,
wherein a light exit side of the light emitting diode chip is free of the matrix material and free of the particles.

13. The component according to claim 1,
wherein a specific thermal conductivity of the particles is higher than a specific thermal conductivity of the matrix material by at least a factor of 10,
wherein the particles are present percolated, so that thermal conduction paths are formed by the particles in the matrix material.

14. The component according to claim 1,
in which, in addition to the particles made of the glass ceramic, at least one type of further particles is present in order to stabilize the housing mechanically and/or thermally and/or which are suitable for increasing a reflectivity of the housing,
wherein the further particles are of a ceramic, of a glass, of a plastic and/or of a metal.

15. A method for producing components according to claim 1 comprising the steps:
providing a glass and performing a temperature treatment of the glass so that a glass ceramic is formed, or alternatively directly generating and/or providing a glass ceramic so that the particles are formed or so that a raw material for the particles is formed;
optionally generating the particles from the raw material in a separate step;
adding the particles to the matrix material so that a molding mass is formed, and
filling a mold with the molding mass by means of casting, injection and/or pressing, and curing to form the housing.

16. The method according to claim 15,
further comprising the step of shaping the particles resulting from the raw material or from the glass ceramic into spherical or nearly spherical particles by means of comminution, rounding, temperature treatment and/or spray pyrolysis.

17. The method according to claim 15,
wherein the glass is an aluminosilicate glass and comprises or is made exclusively from the following starting materials:
$SiO_2$ with a weight fraction between 15% and 70% inclusive,
$Al_2O_3$ with a weight fraction between 2% and 30% inclusive,
$TiO_2$ with a weight fraction between 20% and 40% inclusive,
$ZrO_2$ with a weight fraction between 0.5% and 30%, and
Alkali oxides and alkaline earth oxides with a total weight fraction of not more than 15%.

18. The method according to claim 15,
wherein the temperature treatment of the glass to the glass ceramic is carried out at least temporarily at a temperature between 105% and 130% inclusive of a glass transition temperature of the glass, specified in K.

19. The method according to claim 15,
wherein no further temperature treatment of a molten raw material is performed, so that directly the glass ceramic is produced from powdered starting materials, without an intermediate step via a glass.

* * * * *